(12) United States Patent
Tetelbaum

(10) Patent No.: US 7,370,309 B2
(45) Date of Patent: May 6, 2008

(54) METHOD AND COMPUTER PROGRAM FOR DETAILED ROUTING OF AN INTEGRATED CIRCUIT DESIGN WITH MULTIPLE ROUTING RULES AND NET CONSTRAINTS

(75) Inventor: Alexander Tetelbaum, Hayward, CA (US)

(73) Assignee: LSI Logic Corporation, Milpitas, CA (US)

( * ) Notice: Subject to any disclaimer, the term of this patent is extended or adjusted under 35 U.S.C. 154(b) by 244 days.

(21) Appl. No.: 11/244,486

(22) Filed: Oct. 5, 2005

(65) Prior Publication Data

US 2007/0079274 A1    Apr. 5, 2007

(51) Int. Cl.
*G06F 17/50* (2006.01)

(52) U.S. Cl. .............................. 716/14; 716/5; 716/12; 716/13

(58) Field of Classification Search .................... 716/5, 716/12–14
See application file for complete search history.

(56) References Cited

U.S. PATENT DOCUMENTS 6,925,626 B2 *  8/2005  Nguyen et al. ............... 716/12
7,117,464 B2 * 10/2006  Frank et al. .................... 716/5

* cited by examiner

*Primary Examiner*—Vuthe Siek
(74) *Attorney, Agent, or Firm*—Eric James Whitesell

(57) ABSTRACT

A method of routing an integrated circuit design includes steps of receiving as input at least a portion of an integrated circuit design including at least two separate routing rules assigned to the same net for routing the integrated circuit design, formulating a single combined routing rule as a function of content of each of the separate routing rules, and generating as output the combined routing rule and a routing rule assignment that assigns the combined routing rule to the net.

16 Claims, 9 Drawing Sheets

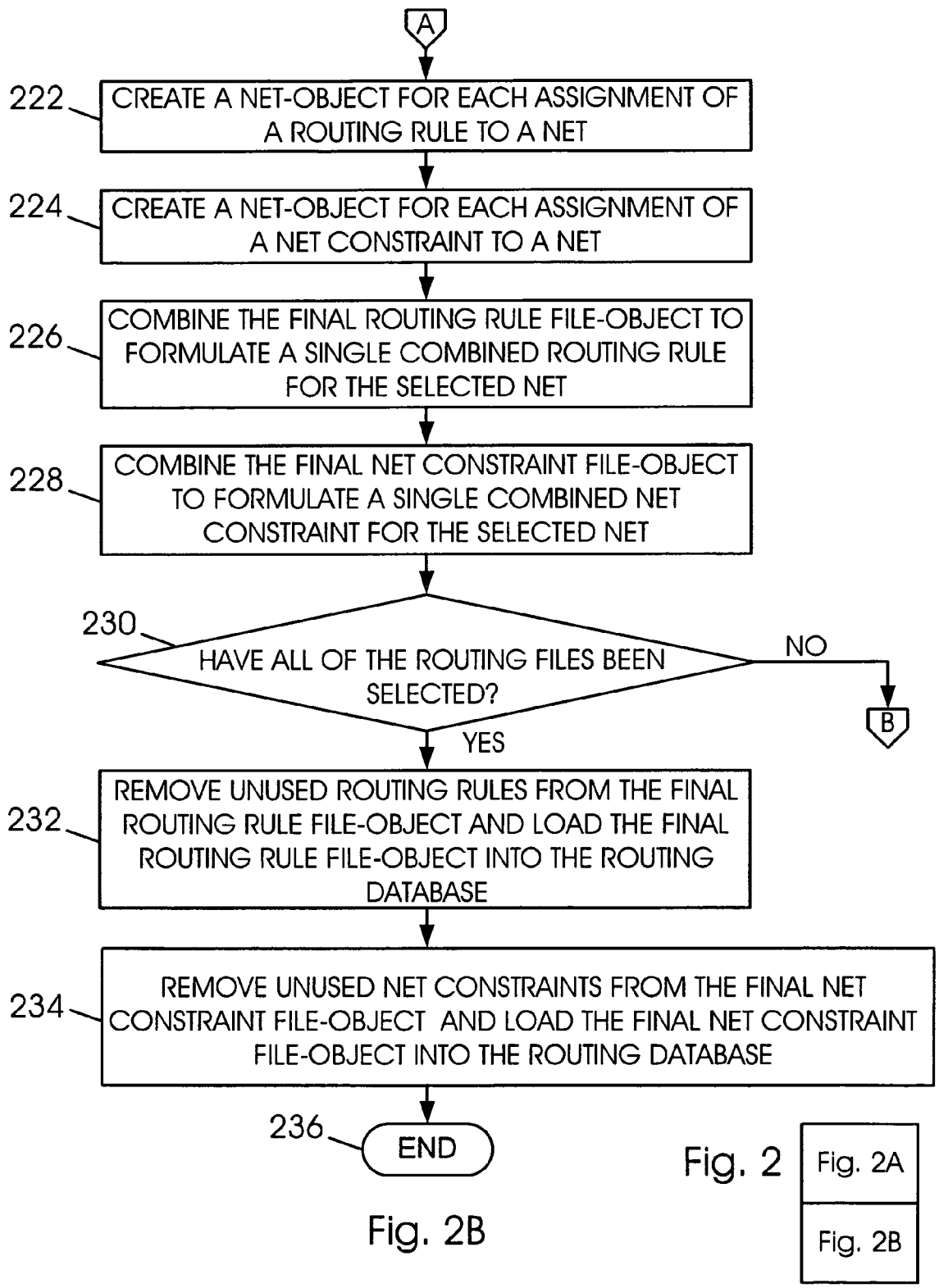

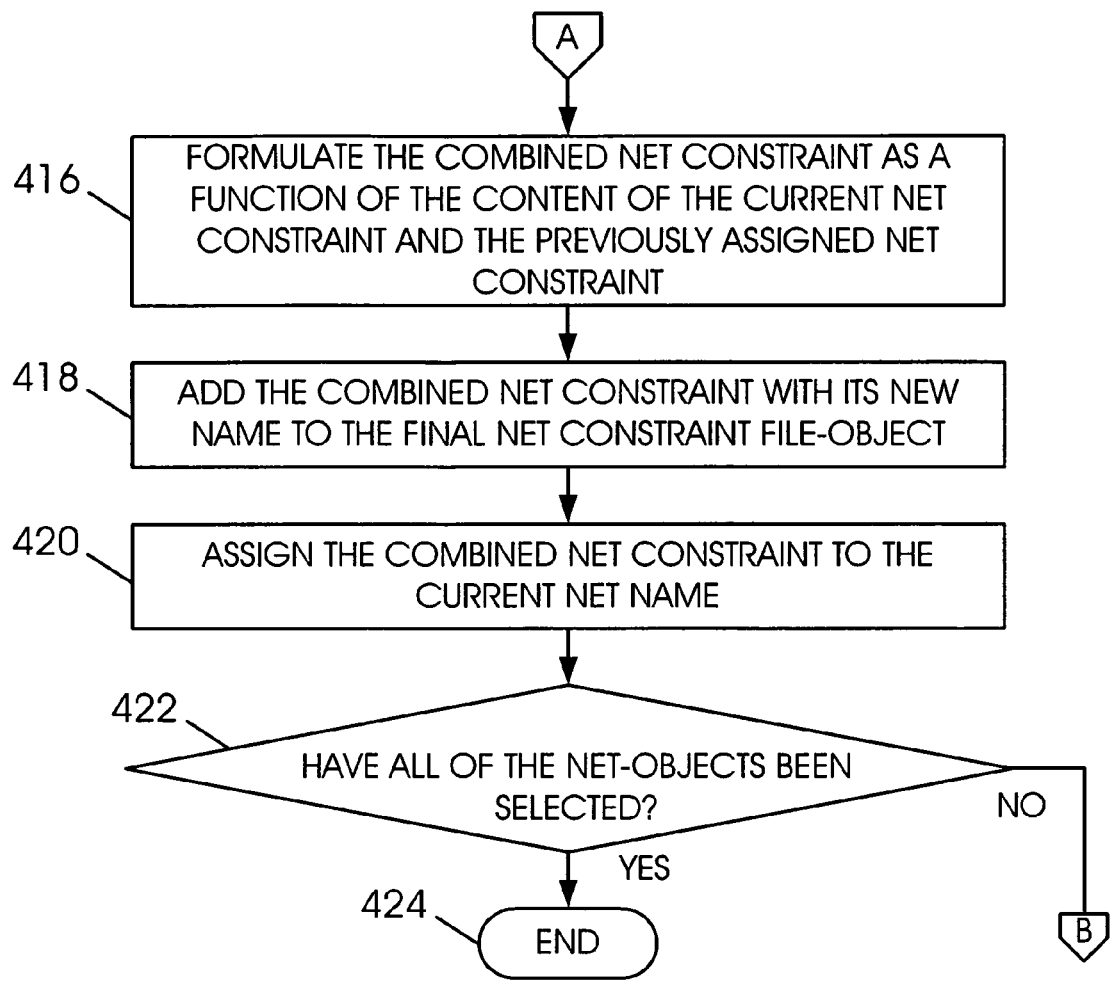
Fig. 4B  Fig. 4
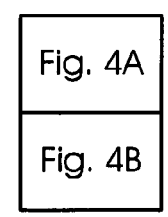

METHOD AND COMPUTER PROGRAM FOR DETAILED ROUTING OF AN INTEGRATED CIRCUIT DESIGN WITH MULTIPLE ROUTING RULES AND NET CONSTRAINTS

BACKGROUND OF THE INVENTION

1. Field of the Invention

The present invention is directed to the design and manufacture of integrated circuits. More specifically, but without limitation thereto, the present invention is directed to a method of detailed routing of an integrated circuit design.

2. Description of Related Art

In a typical design cycle for manufacturing an integrated circuit, each net in the integrated circuit design is routed according to specific routing rules. In addition to the standard routing rules that are typically provided in a physical design database used to manufacture the integrated circuit, special routing rules may be required, for example, to satisfy timing constraints in a specific circuit design. The special routing rules typically include variables such as net spacing and trace width that affect the routing based on properties of the net being routed and net constraints such as metal layers in which certain routing rules are to be applied.

SUMMARY OF THE INVENTION

A method of placing and routing an integrated circuit design includes steps of:
(a) receiving as input at least a portion of an integrated circuit design including at least two separate routing rules assigned to the same net for routing the integrated circuit design;
(b) formulating a single combined routing rule as a function of content of each of the separate routing rules; and
(c) generating as output the combined routing rule and a routing rule assignment that assigns the combined routing rule to the net.

In another embodiment, a computer program product includes:
a medium for embodying a computer program for input to a computer; and
a computer program embodied in the medium for causing the computer to perform steps of:
(a) receiving as input at least a portion of an integrated circuit design including at least two separate routing rules assigned to the same net for routing the integrated circuit design;
(b) formulating a single combined routing rule as a function of content of each of the separate routing rules; and
(c) generating as output the combined routing rule and a routing rule assignment that assigns the combined routing rule to the net.

BRIEF DESCRIPTION OF THE DRAWINGS

The above and other aspects, features and advantages will become more apparent from the description in conjunction with the following drawings presented by way of example and not limitation, wherein like references indicate similar elements throughout the several views of the drawings, and wherein.

Figure 1:
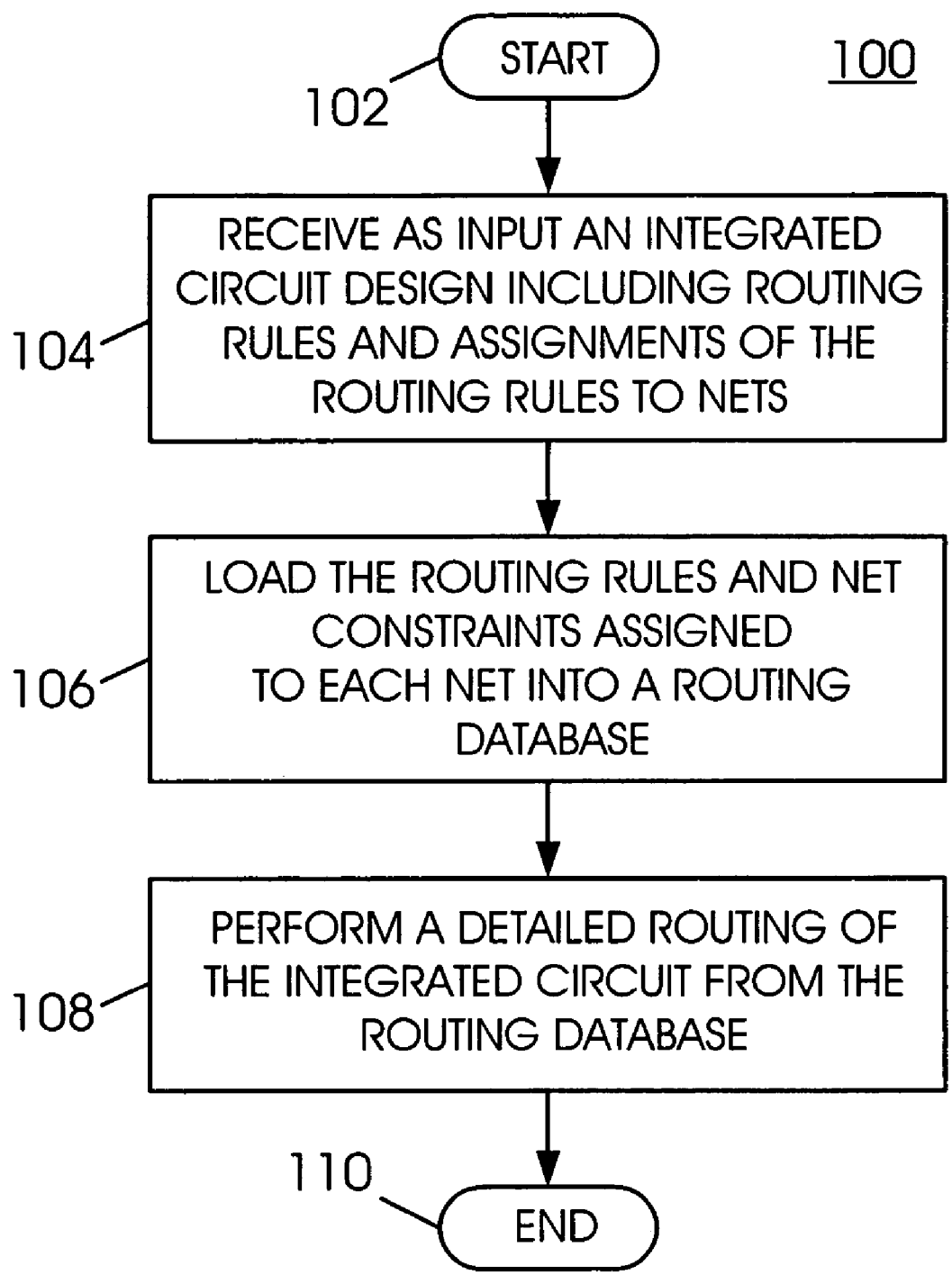
FIG. 1 illustrates a flow chart for a typical routing method of the prior art.

Elements in the figures are illustrated for simplicity and clarity and have not necessarily been drawn to scale. For example, the dimensions, sizing, and/or relative placement of some of the elements in the figures may be exaggerated relative to other elements to clarify distinctive features of the illustrated embodiments. Also, common but well-understood elements that may be useful or necessary in a commercially feasible embodiment are often not depicted in order to facilitate a less obstructed view of the illustrated embodiments.

DESCRIPTION OF THE ILLUSTRATED EMBODIMENTS

The following description is not to be taken in a limiting sense, rather for the purpose of describing by specific examples the general principles that are incorporated into the illustrated embodiments. For example, certain actions or steps may be described or depicted in a specific order to be performed. However, practitioners of the art will understand that the specific order is only given by way of example and that the specific order does not exclude performing the described steps in another order to achieve substantially the same result. Also, the terms and expressions used in the description have the ordinary meanings accorded to such terms and expressions in the corresponding respective areas of inquiry and study except where other meanings have been specifically set forth herein.

An important step in the design cycle of an integrated circuit is the routing of each net in the integrated circuit that interconnects the functional elements such as logic gates and flip-flops. A typical computer aided design (CAD) system for integrated circuits allows a user to specify special routing rules for certain nets in the integrated circuit in addition to standard routing rules that may be included in a routing rule database for a specific technology to be used in the manufacture of the integrated circuit. These special routing rules may be generated by design tools used in conjunction with the computer aided design (CAD) system in the form of special route files that include variable routing rules and net constraints. Also, special routing rules for some nets may be generated manually during an engineering change order (ECO). Examples of routing rules include trace spacing and trace width. Examples of net constraints include metal layer constraints that specify a certain metal layers for a net or a minimum and maximum range of metal layers in which a certain net may be routed; routing direction constraints, such as horizontal and vertical; and maximum trace length constraints, such as 900 microns.

The routing rules and net constraints are assigned to nets by the design tools via a routing rule assignment or a net constraint assignment. For example, a routing rule for a trace spacing of 50 microns may be assigned to a net named "NET_5001". Because the design tools generally operate independently of one another, more than one routing rule and/or more than one net constraint may be assigned to the same net in the routing files generated by different design tools and by engineering change orders (ECO) used to design the integrated circuit.

A problem with routing algorithms used in a typical computer aided design (CAD) system for integrated circuits is that each of the special routing files generated by the user is simply loaded sequentially into a routing database. As a result, a routing rule or net constraint that controls the same variable as a previously loaded routing rule or net constraint for the same net replaces the previous routing rule or net constraint. For example, if one routing file specifies a routing rule for a trace spacing of 20 microns for a net, and another routing file specifies a trace spacing of 50 microns for the same net, then the trace spacing for that net will be determined by the order in which the routing files are loaded. Preferably, the trace spacing should be determined by the content of each of the routing rules rather than by the random order in which the routing files are loaded. Similarly, net constraints for the same net are determined by the order in which the routing files are loaded. As a result, the final routing rules and net constraints loaded into the routing database used to perform the detailed routing of the integrated circuit design may disregard important design considerations from the various design tools.

FIG. 1 illustrates a flow chart 100 for a typical routing method of the prior art.

Step 102 is the entry point for the flow chart 100.

In step 104, an integrated circuit design including routing rules and assignments of the routing rules to nets is received as input. For example, the routing rules and assignments may be generated in the form of routing files by various design tools. The routing files typically include net constraints and assignments of the net constraints to nets.

In step 106, the routing rules and net constraints assigned to each net are loaded from the routing files into a routing database. If a routing rule in one routing file that controls a variable such as the trace width or the trace spacing is assigned to a net, and a routing rule controlling the same variable was assigned to the same net by a previously loaded routing rule, then the previously loaded routing rule is replaced by the subsequently loaded routing rule. Likewise, a previously loaded net constraint assigned to a single net is replaced by a subsequently loaded net constraint for the same net.

In step 108, the routing database is used to perform a detailed routing of the integrated circuit.

Step 110 is the exit point for the flow chart 100.

Rather than allowing the routing rules and net constraints assigned to the same net to replace one another as in the method of FIG. 1, the routing rules and net constraints may be combined as described below as a function of their content regardless of the order in which the routing files are loaded, advantageously preserving the integrity of the design incorporated by the various design tools.

In one embodiment, a method of placing and routing an integrated circuit design includes steps of:

(a) receiving as input at least a portion of an integrated circuit design including at least two separate routing rules assigned to the same net for routing the integrated circuit design;

(b) formulating a single combined routing rule as a function of content of each of the separate routing rules; and (c) generating as output the combined routing rule and a routing rule assignment that assigns the combined routing rule to the net.

Figure 2A:
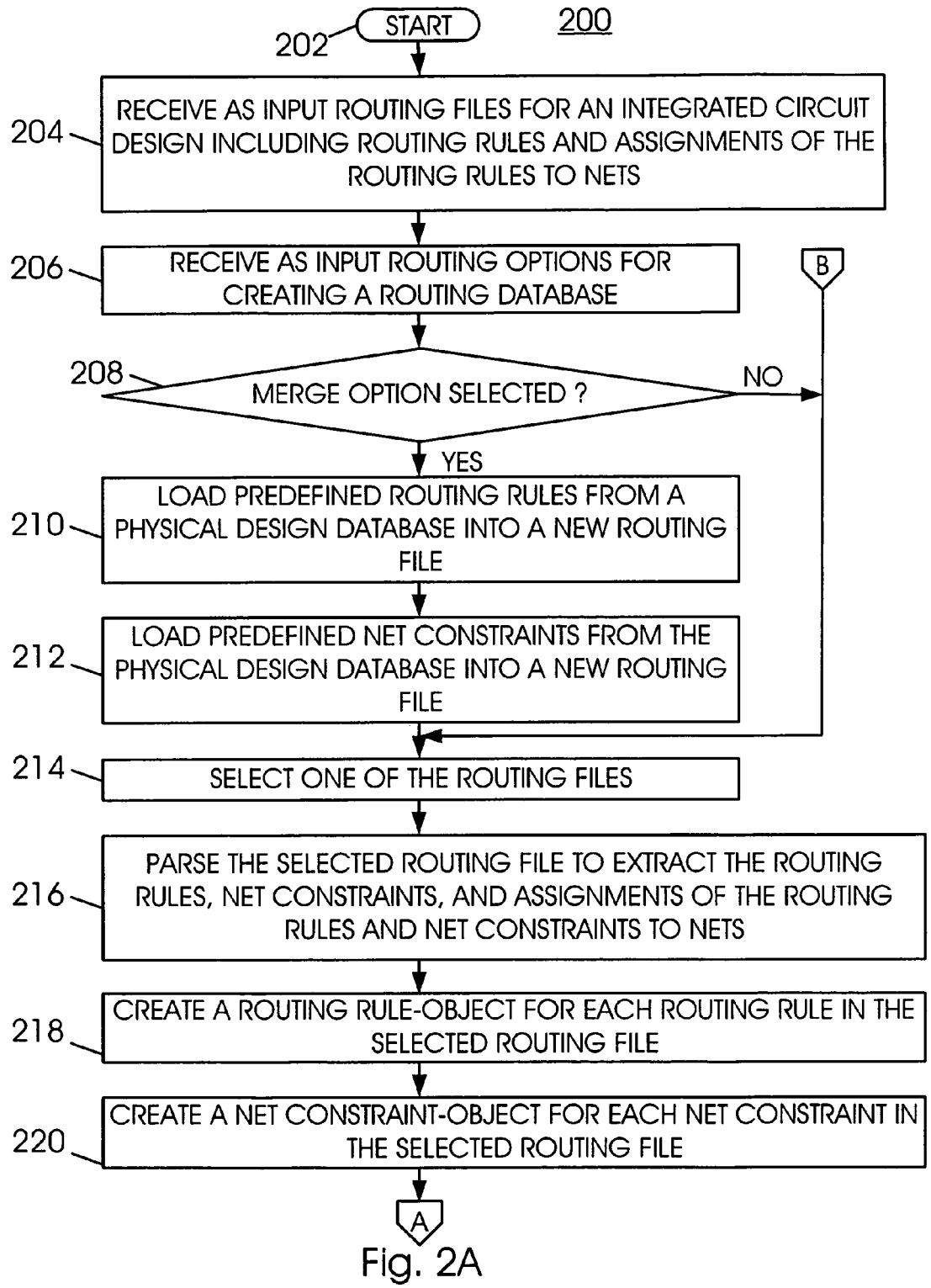
FIG. 2 illustrates a flow chart for a method of combining multiple routing rules and net constraints.

FIG. 2 illustrates a flow chart 200 for a method of combining multiple routing rules and net constraints.

Step 202 is the entry point for the flow chart 200.

In step 204, routing files for an integrated circuit design including routing rules and assignments of the routing rules to nets are received as input, for example, in the same manner as in FIG. 1.

In step 206, routing options for creating a routing database may be received as input. The routing options may include, for example, an option to merge the separate routing rules from the routing files with the routing rules included in a physical design database, an option to ignore the routing rules from the physical design database, and an option to delete the routing rules from the physical design database. Other options may be used, for example, to select criteria for resolving conflicts among routing rules and among net constraints that are assigned to the same net. For example, the highest or most conservative value may be selected to resolve conflicts among multiple variable routing rules for trace width. If two variable routing rules assigned to the same net specify a trace width of 20 microns and 50 microns respectively, then the trace width of 50 microns would be selected using the highest value option. In the following example, the merge option and the highest value option are set by default. However, other default options may be used instead of or in addition to the examples described to practice various embodiments within the scope of the appended claims.

In step 208, if the merge option is selected, then the method continues from step 210. Otherwise, the method continues from step 214.

In step 210, predefined routing rules are loaded from a physical design database into a first new routing file and the first new routing file is received as input.

In step 212, predefined net constraints are loaded from the physical design database into a second new routing file and the second new routing file is received as input.

In step 214, one of the routing files received as input is selected.

In step 216, the selected routing file is parsed according to well-known programming techniques to extract the routing rules, net constraints, and assignments of the routing rules and net constraints to nets.

In step 218, a routing rule-object is created for each routing rule in the selected routing file according to well-known object-oriented programming techniques. Each routing rule-object is added to a final routing rule file-object.

In step 220, a net constraint-object is created for each net constraint in the selected routing file. Each net constraint-object is added to a final net constraint file-object.

In step 222, a net-object is created for each assignment of a routing rule to a net. The net name and the routing rule assigned to the net are included in the net-object and added to the final routing rule file-object.

In step 224, a net-object is created for each assignment of a net constraint to a net. The net name and the net constraint assigned to the net are included in the net-object and added to the final net constraint file-object.

In step 226, the final routing rule file-object is combined to formulate a single combined routing rule for the selected net. This step will be further described in a separate figure.

In step 228, the final net constraint file-object is combined to formulate a single combined net constraint for the selected net. This step will be further described in a separate figure.

In step 230, if all of the routing files have been selected, then the method continues from step 232. Otherwise, if any routing file remains to be selected, then the method continues from step 214.

In step 232, unused routing rules are removed from the final routing rule file-object, and the final routing rule file-object is loaded into the routing database.

In step 234, unused net constraints are removed from the final net constraint file-object, and the final net constraint file-object is loaded into the routing database. The detailed routing is then performed from the routing database in the same manner as in FIG. 1.

Step 236 is the exit point of the flow chart 200.

Figure 3B:
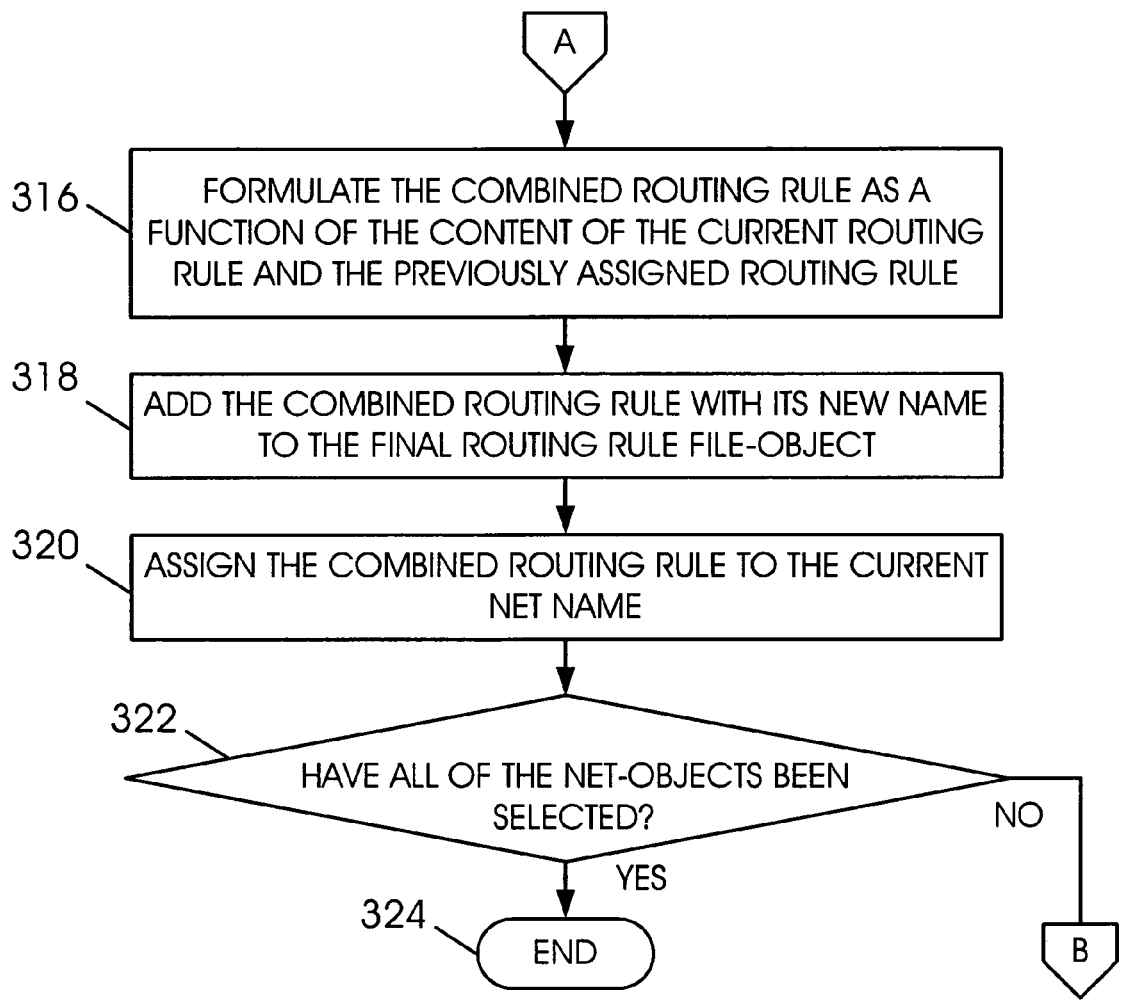
FIG. 3 illustrates a flow chart for a method of combining the final routing rule file-object created by the method of FIG. 2 to formulate a single combined routing rule for the selected net.
Figure 3A:
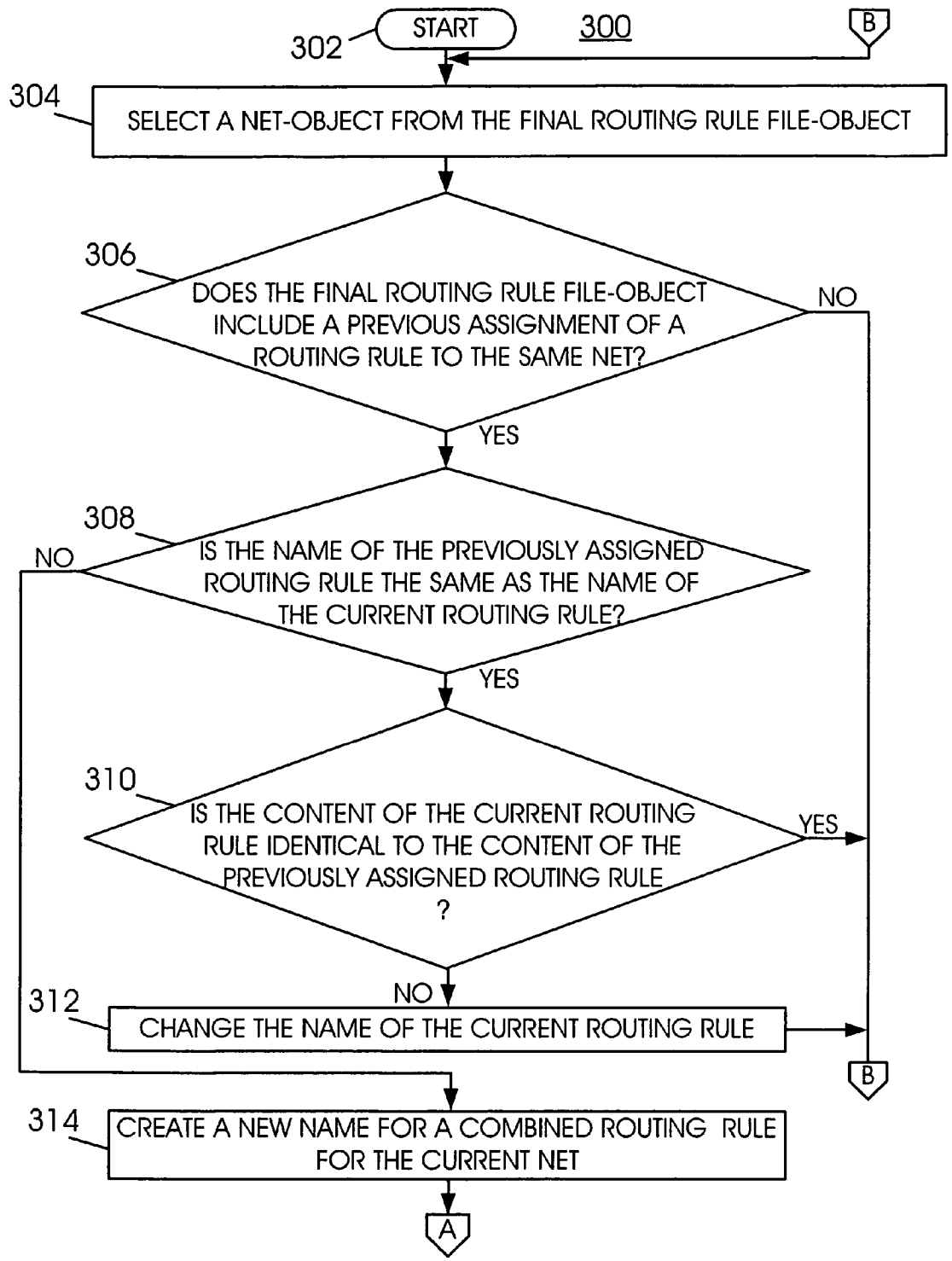

FIG. 3 illustrates a flow chart 300 for a method of combining the final routing rule file-object created by the method of FIG. 2 to formulate a single combined routing rule for the selected net.

Step 302 is the entry point for the flow chart 300.

In step 304, a net-object is selected from the final routing rule file-object, and the current net name and the current routing rule name are extracted from the selected net-object.

In step 306, the final routing rule file-object is searched for a previous assignment of a routing rule to the current net. If a previous assignment is found, then the method continues from step 308. Otherwise, the method continues from step 322.

In step 308, the name of the routing rule previously assigned to the current net is extracted from the routing rule-object for the previous assignment. If the name of the previously assigned routing rule is the same as the name of the current routing rule, then the method continues from step 310. Otherwise, the method continues from step 314.

In step 310, if the content of the current routing rule is identical to the content of the previously assigned routing rule, then the method continues from step 322. For example, the same routing rule may be duplicated in the final routing rule file-object. Otherwise, the method continues from step 312.

In step 312, the name of the current routing rule is changed to a unique name in the final routing rule file-object, and the method continues from step 322.

In step 314, a new name for a combined routing rule for the current net is created that is unique among the routing rule names in the final routing rule file-object.

In step 316, the combined routing rule is formulated as a function of the content of the current routing rule and the previously assigned routing rule, either to merge non-conflicting routing rules or to resolve a conflict. For example, if the current routing rule specifies a trace width of 20 microns and the previously assigned routing rule assigns a trace width of 50 microns, then the conflict may be resolved, for example, by comparing the two values and selecting the more conservative value of 50 microns. The content of routing rules that do not conflict is merged to formulate a single combined routing rule. For example, if the current routing rule specifies a trace width of 50 microns for a net and a routing rule previously assigned to the same net specifies a trace spacing of 90 microns, then the combined routing rule would specify a trace width of 50 microns and a trace spacing of 90 microns.

Other criteria may be used to resolve conflicts between routing rules to practice various embodiments within the scope of the appended claims. Resolving conflicts between routing rules as a function of their content differs substantially from the method of FIG. 1, where conflicts are resolved by the order in which the routing files are received, and the final routing rule may vary each time the order of the routing files is changed.

In step 318, the combined routing rule with its new name is added to the final routing rule file-object.

In step 320, the combined routing rule is assigned to the current net name, and the assignment is added to the final routing rule file-object.

In step 322, if all net-objects in the final routing rule file-object have been selected, then the method continues from step 324. Otherwise, the method continues from step 304.

Step 324 is the exit point for the flow chart 300.

Figure 4A:
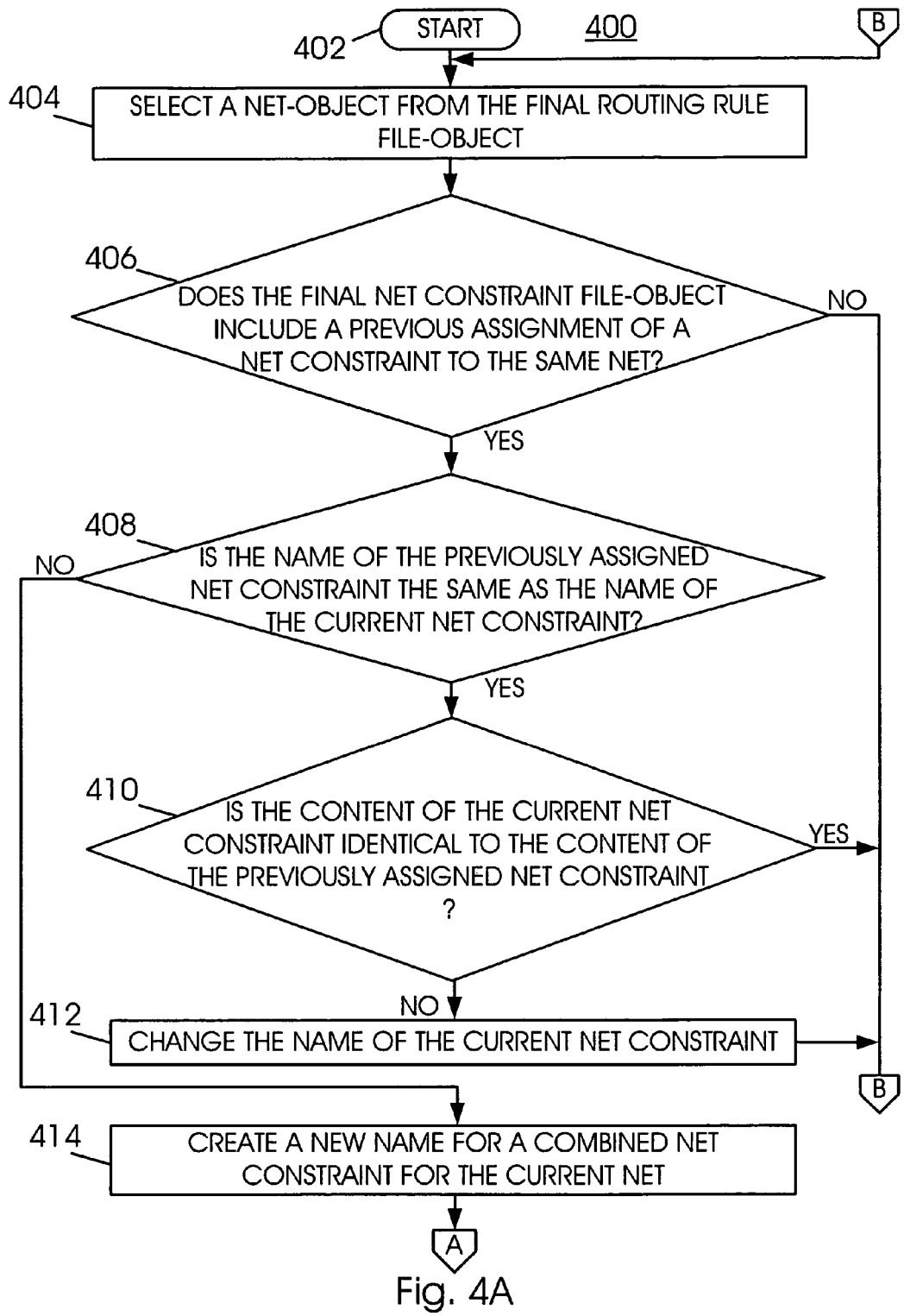
FIG. 4 illustrates a flow chart for a method of combining the final net constraint file-object created by the method of FIG. 2 to formulate a single combined net constraint for the selected net.

FIG. 4 illustrates a flow chart 400 for a method of combining the final net constraint file-object created by the method of FIG. 2 to formulate a single combined net constraint for the selected net.

Step 402 is the entry point for the flow chart 400.

In step 404, a net-object is selected from the final net constraint file-object, and the current net name and the current net constraint name are extracted from the selected net-object.

In step 406, the final net constraint file-object is searched for a previous assignment of a net constraint to the current net. If a previous assignment is found, then the method continues from step 408. Otherwise, the method continues from step 422.

In step 408, the name of the net constraint previously assigned to the current net is extracted from the net constraint-object for the previous assignment. If the name of the previously assigned net constraint is the same as the name of the current net constraint, then the method continues from step 410. Otherwise, the method continues from step 414.

In step 410, if the content of the current net constraint is identical to the content of the previously assigned net constraint, then the method continues from step 422. For example, the same net constraint may be duplicated in the final net constraint file-object. Otherwise, the method continues from step 412.

In step 412, the name of the current net constraint is changed to a unique name in the final net constraint file-object, and the method continues from step 422.

In step 414, a new name for a combined net constraint is generated that is unique among the net constraint names in the final net constraint file-object.

In step 416, the combined net constraint is formulated as a function of the content of the current net constraint and the previously assigned net constraint, either to merge non-conflicting net constraints or to resolve a conflict. For example, if the current net constraint specifies a maximum trace length of 800 microns and the previously assigned net constraint specifies a maximum trace length of 1000 microns, then the conflict may be resolved, for example, by comparing the two values and selecting the more conservative value of 800 microns. The content of net constraints that do not conflict is merged to formulate a single combined net constraint. For example, if the current net constraint specifies a maximum trace length of 800 microns for a net and a net constraint previously assigned to the same net specifies a vertical routing direction, then the combined net constraint would specify a maximum trace length of 800 microns and a vertical routing direction.

Other criteria may be used to resolve conflicts between net constraints to practice various embodiments within the scope of the appended claims. Resolving conflicts between net constraints as a function of their content differs substantially from the method of FIG. 1, where conflicts are resolved by the order in which the routing files are received, and the final net constraint may vary each time the order of the routing files is changed.

In step 418, the combined net constraint with its new name is added to the final net constraint file-object.

In step 420, the combined net constraint is assigned to the current net name, and the assignment is added to the final net constraint file-object.

In step 422, if all net-objects in the final net constraint file-object have been selected, then the method continues from step 424. Otherwise, the method continues from step 404.

Step 424 is the exit point for the flow chart 400.

Figure 5:
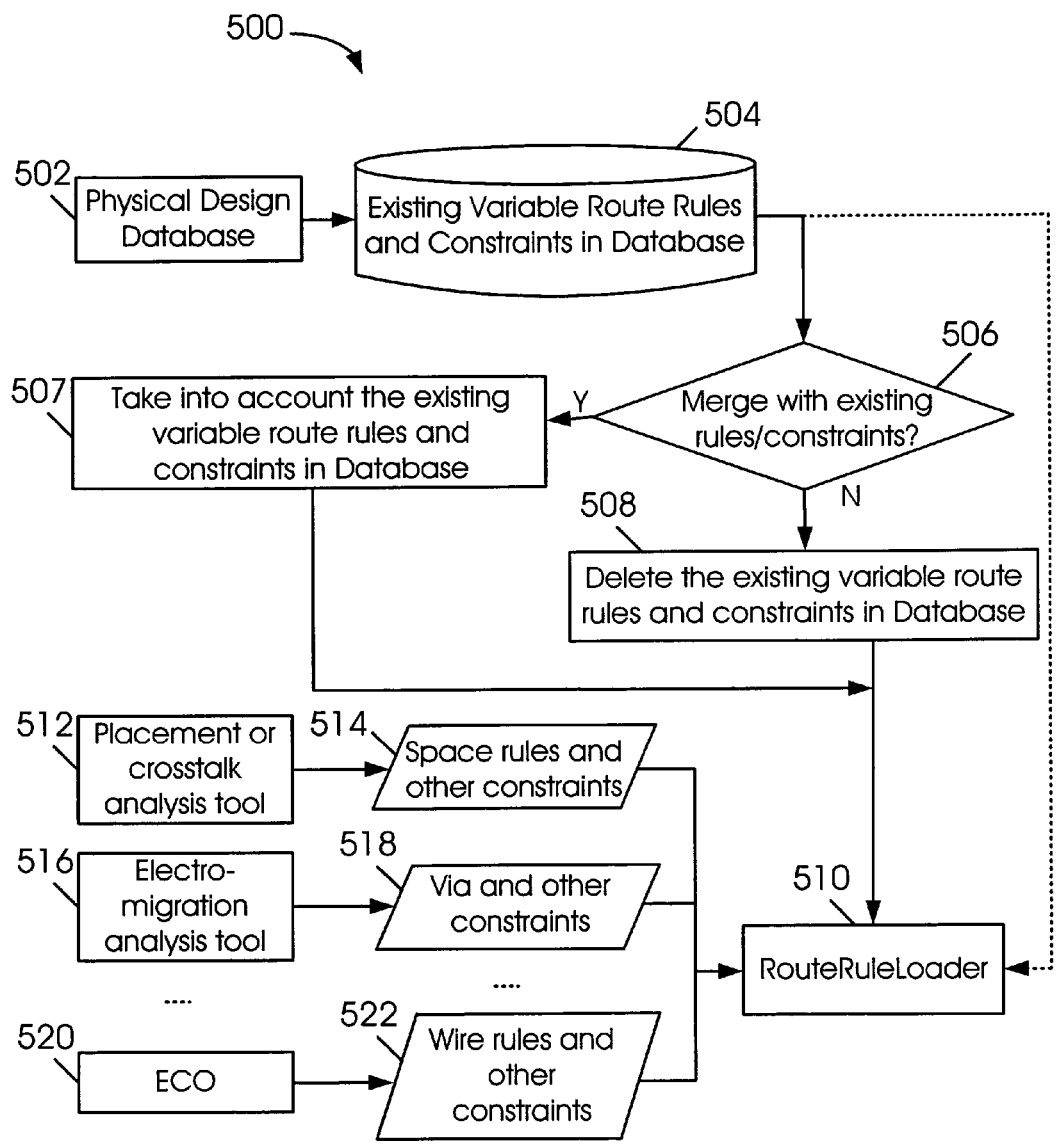
FIG. 5 illustrates a flow diagram for a computer program that incorporates the method of FIG. 2.

FIG. 5 illustrates a flow diagram 500 for a computer program that incorporates the method of FIG. 2. Shown in FIG. 5 are a physical design database 502, a set of existing variable routing rules and net constraints 504, a merge option 506, a new input file generator 507, a delete function 508, a routing rule load function 510, a placement or crosstalk analysis tool 512, trace spacing routing rules and net constraints 514, an electromigration analysis tool 516, via routing rules and net constraints 518, an engineering change order tool 520, and trace routing rules and net constraints 522.

In FIG. 5, the physical design database 502 contains the information required to design the integrated circuit up to the detailed routing step. The set, of existing variable routing rules and net constraints 504 is a subset of the information contained in the physical design database 502. The merge option 506 is used to include or exclude the routing rules and net constraints in the set of existing variable routing rules and net constraints 504 in the detailed routing of the integrated circuit design. The new input file generator 507 takes into account the existing routing rules and net constraints 504 by generating a new input file for the routing rules and another new input file for the net constraints. The new input files are merged by the routing rule load function 510. The delete function 508 removes the routing rules and net constraints in the set of existing variable routing rules and net constraints 504 if the merge option is switched off. The routing rule load function 510 combines the trace spacing routing rules and net constraints 514 generated by the placement or crosstalk analysis tool 512, the via routing rules and net constraints 518 generated by the electromigration analysis tool 516, and the trace routing rules and net constraints 522 generated by the engineering change order tool 520 into a single combined routing rule and a single combined net constraint for each net in the integrated circuit design. Alternatively, the set of existing variable routing rules and net constraints 504 may be received directly by the routing rule load function 510 to practice various embodiments within the scope of the appended claims, bypassing the merge option 506 and the delete function 508.

The flow chart described above with reference to FIG. 2 may also be automated by instructions for a computer. The instructions may be embodied in a disk, a CD-ROM, and other computer readable media according to well known computer programming techniques.

In another embodiment, a computer program product includes:

a medium for embodying a computer program for input to a computer; and a computer program embodied in the medium for causing the computer to perform steps of:

(a) receiving as input at least a portion of an integrated circuit design including at least two routing rules assigned to the same net for routing the integrated circuit design;

(b) formulating a single combined routing rule as a function of content of each of the routing rules; and (c) generating as output the combined routing rule and a routing rule assignment that assigns the combined routing rule to the net.

Figure 6:
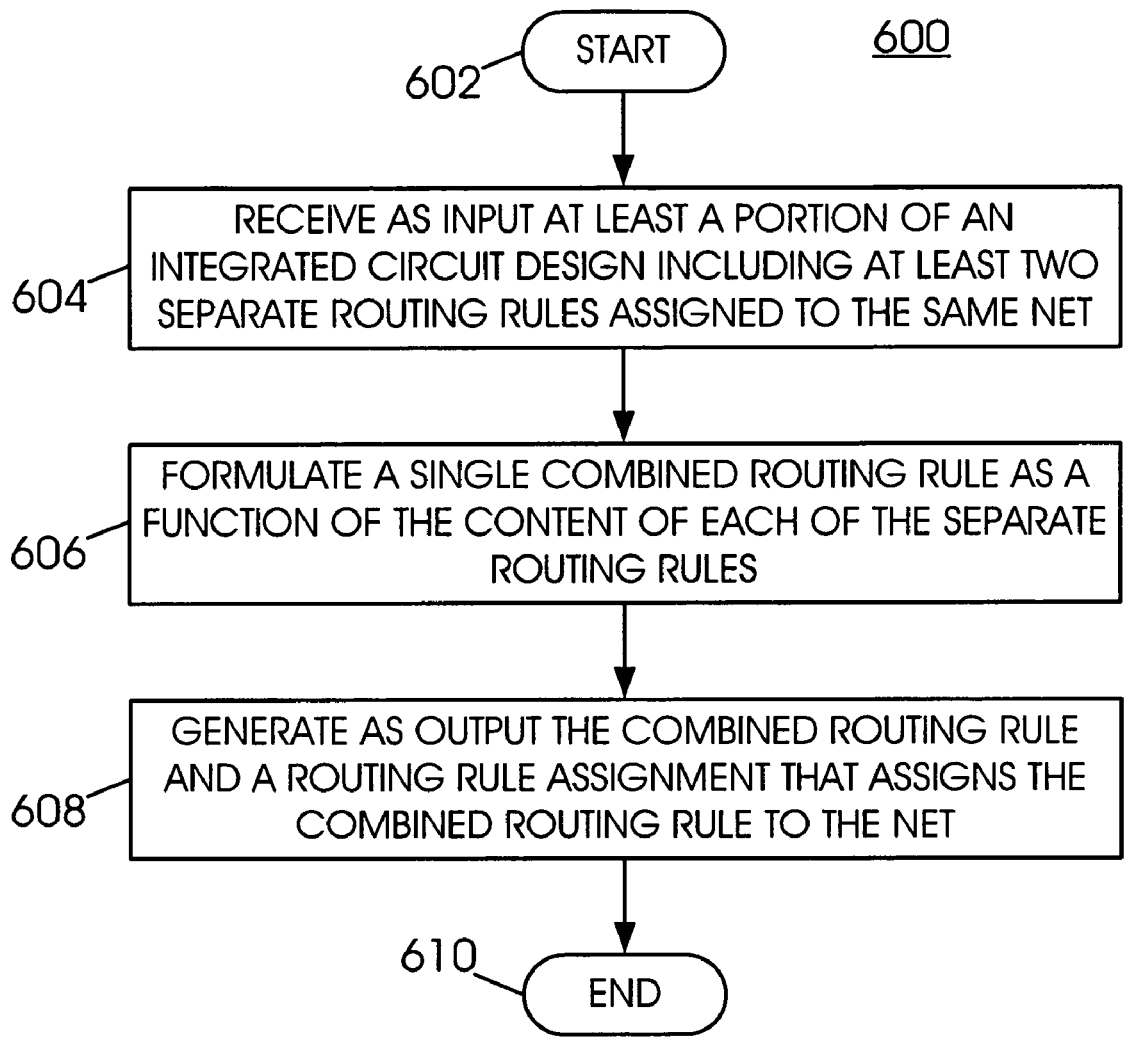
FIG. 6 illustrates a flow chart for a computer program that summarizes the method of FIG. 2.

FIG. 6 illustrates a flow chart 600 for a computer program that summarizes the method of FIG. 2.

Step 602 is the entry point of the flow chart 600.

In step 604, at least a portion of an integrated circuit design is received as input including at least two separate routing rules assigned to the same net for routing the integrated circuit design.

In step 606, a single combined routing rule is formulated as a function of content of each of the separate routing rules. Because the combined routing rule is derived from the content of each of the separate routing rules assigned to the same net, the resulting combined routing rule is independent of the order in which the separate routing rules are received. Also, the combined routing rule takes into account the information from each of the separate routing rules assigned to the same net, even if only a variable value from one of the separate routing rules is selected to be included in the combined routing rule.

In step 608, the combined routing rule and a routing rule assignment that assigns the combined routing rule to the net is generated as output. For example, the combined routing rule and the routing rule assignment may be loaded into a routing database used by a commercially available computer automated design (CAD) system for routing integrated circuits. In the same manner, a combined routing rule and a routing rule assignment that assigns the combined routing rule to the net may be generated as output for each net in the integrated circuit design so that the combined routing rule assigned to each net takes into account the content of all the multiple routing rules assigned to the same net regardless of the order in which the multiple routing rules were received.

Step 610 is the exit point of the flow chart 600.

Although the flowchart descriptions above are described and shown with reference to specific steps performed in a specific order, these steps may be combined, sub-divided, or reordered without departing from the scope of the claims. Unless specifically indicated, the order and grouping of steps is not a limitation of other embodiments that may lie within the scope of the claims.

The specific embodiments and applications thereof described above are for illustrative purposes only and do not preclude modifications and variations that may be made within the scope of the following claims.

What is claimed is:

1. A method comprising steps of:

(a) receiving as input at least a portion of an integrated circuit design including at least two separate routing rules assigned to the same net for routing the integrated circuit design;

(b) formulating a single combined routing rule as a function of content of each of the separate routing rules to merge non-conflicting separate routing rules or to resolve a conflict between conflicting separate routing rules for the same net; and (c) generating as output the combined routing rule and a routing rule assignment that assigns the combined routing rule to the same net.

2. The method of claim 1 further comprising a step of receiving as input an option to merge routing rules included in a routing rule database with the separate routing rules received as input.

3. The method of claim 2 further comprising a step of receiving as input an option to ignore the routing rules included in the routing rule database.

4. The method of claim 1 wherein the separate routing rules include at least one of trace width and trace spacing.

5. The method of claim 1 further comprising steps of:
   (d) receiving as input at least a portion of an integrated circuit design including at least two separate net constraints assigned to the same net for routing the integrated circuit design;
   (e) formulating a single combined net constraint as a function of content of each of the separate net constraints to merge non-conflicting separate net constraints or to resolve a conflict between conflicting separate net constraints for the same net; and
   (f) generating as output the combined net constraint and a net constraint assignment that assigns the combined net constraint to the same net.

6. The method of claim 5 further comprising a step of receiving as input an option to merge net constraints included in a net constraint database with the separate net constraints received as input.

7. The method of claim 6 further comprising a step of receiving as input an option to ignore the net constraints included in the net constraint database.

8. The method of claim 5 wherein the separate net constraints include at least one of a metal layer constraint, a routing direction constraint, and a maximum wire length constraint.

9. A computer readable storage medium tangibly embodying instructions for a computer that when executed by the computer implement a method comprising steps of:
   (a) receiving as input at least a portion of an integrated circuit design including at least two separate routing rules assigned to the same net for routing the integrated circuit design;
   (b) formulating a single combined routing rule as a function of content of each of the separate routing rules to merge non-conflicting separate routing rules or to resolve a conflict between conflicting separate routing rules for the same net; and
   (c) generating as output the combined routing rule and a routing rule assignment that assigns the combined routing rule to the same net.

10. The computer readable storage medium of claim 9 further comprising a step of receiving as input an option to merge routing rules included in a routing rule database with the separate routing rules received as input.

11. The computer readable storage medium of claim 10 further comprising a step of receiving as input an option to ignore the routing rules included in the routing rule database.

12. The computer readable storage medium of claim 9 wherein the separate routing rules include at least one of trace width and trace spacing.

13. The computer readable storage medium of claim 9 further comprising steps of:
   (d) receiving as input at least a portion of an integrated circuit design including at least two separate net constraints assigned to the same net for routing the integrated circuit design;
   (e) formulating a single combined net constraint as a function of content of each of the separate net constraints to merge non-conflicting separate net constraints or to resolve a conflict between conflicting separate net constraints for the same net; and
   (f) generating as output the combined net constraint and a net constraint assignment that assigns the combined net constraint to the same net.

14. The computer readable storage medium of claim 13 further comprising a step of receiving as input an option to merge net constraints included in a net constraint database with the separate net constraints received as input.

15. The computer readable storage medium of claim 14 further comprising a step of receiving as input an option to ignore the net constraints included in the net constraint database.

16. The computer readable storage medium of claim 13 wherein the separate net constraints include at least one of a metal layer constraint, a routing direction constraint, and a maximum wire length constraint.

* * * * *